United States Patent [19]
Hayashi et al.

[11] Patent Number: 5,529,846
[45] Date of Patent: Jun. 25, 1996

[54] HIGHLY-ORIENTED DIAMOND FILM HEAT DISSIPATING SUBSTRATE

[75] Inventors: Kazushi Hayashi, Kobe; Koji Kobashi, Nishinomiya, both of Japan; Jesko A. von Windheim, Raleigh, N.C.

[73] Assignee: Kobe Steel USA, Inc., Research Triangle Park, N.C.

[21] Appl. No.: 468,450

[22] Filed: Jun. 6, 1995

Related U.S. Application Data

[63] Continuation of Ser. No. 61,853, May 14, 1993, abandoned.

[51] Int. Cl.$^6$ .............................................. H01L 31/0312
[52] U.S. Cl. .......................... 428/408; 428/446; 428/704
[58] Field of Search ..................................... 428/408, 446, 428/704

[56] References Cited

U.S. PATENT DOCUMENTS

| | | | |
|---|---|---|---|
| 4,806,900 | 2/1989 | Fujimori et al. | 338/22 R |
| 4,863,529 | 9/1989 | Imai et al. | 148/33.4 |
| 5,066,938 | 11/1991 | Kobashi et al. | 338/22 SD |
| 5,089,802 | 2/1992 | Yamazaki | 338/22 SD |
| 5,144,380 | 9/1992 | Kimoto et al. | 357/22 |
| 5,183,530 | 2/1993 | Yamazaki | 156/643 |

FOREIGN PATENT DOCUMENTS

| | | |
|---|---|---|
| 0417645 | 3/1991 | European Pat. Off. . |
| 0445998 | 9/1991 | European Pat. Off. . |
| 0458530 | 11/1991 | European Pat. Off. . |
| 2252202 | 7/1992 | United Kingdom . |

OTHER PUBLICATIONS

Geis "Growth of textured diamond films on foreign substrates from attached seed crystals" App. Phy. Let 55(6) Aug. 7, 1989, pp. 550–552.

U.S. Patent Application Serial No. 07/811,425, filed Dec. 20, 1991, *Nucleation Enhancement for Chemical Vapor Deposition of Diamond*, Stoner et al., now abandoned.

U.S. Patent Application Serial No. 07/937,481, filed Aug. 28, 1992, *Nucleation Enhancement for Chemical Vapor Deposition of Diamond*, Stoner et al., allowed Mar. 28, 1994.

U.S. Patent Application Serial No. 08/035,643, filed Mar. 23, 1993, *Microelectronic Structure Having an Array of Diamond Structures on a Nondiamond Substrate and Associated Fabrication Methods*, Dreifus et al., pending.

*Primary Examiner*—A. A. Turner
*Attorney, Agent, or Firm*—Bell, Seltzer, Park & Gibson

[57] ABSTRACT

The present invention relates to a heat dissipating substrate with a highly-oriented diamond film of a low crystal inclination and a low density grain boundaries and having a significantly high thermal conductivity. At least 90% of the surface area of the highly-oriented diamond film is covered with either (100) or (111) crystal planes, and the differences $\{\Delta\alpha, \Delta\beta, \Delta\gamma\}$ of the Euler angles, which represent the orientations of the crystals, between adjacent (100) or (111) crystal planes, simultaneously satisfies the following relationship: $|\Delta\alpha|\leq 5°$, $|\Delta\beta|\leq 5°$, and $|\Delta\gamma|\leq 5°$. In addition, this highly-oriented diamond film can be grown on a nondiamond substrates, and therefore the diamond film with a large surface area can be obtained. Thus, the present invention provides the heat dissipating substrate with an excellent thermal conductivity at low cost.

6 Claims, 2 Drawing Sheets

HIGHLY-ORIENTED DIAMOND FILM HEAT DISSIPATING SUBSTRATE

This is a Continuation of application Ser. No. 08/061,853, filed on 14 May 1993 now abandoned.

BACKGROUND OF THE INVENTION

1. Field of the Invention

The present invention relates to a heat dissipating substrate suitable for use as electronic devices such as semiconducting lasers and diodes, particularly relates to a highly-oriented diamond film heat dissipating substrate with improved radiating characteristics.

2. Prior Art References

Semiconductor devices are becoming increasingly high speed and high density. According to such a trend, heat generation of semiconducting elements and heat dissipation thereof are becoming important problems.

One of the approaches to these problems is the improvement of thermal conductivity of the substrate itself on which semiconducting elements are formed. The substrate material used for integrated circuits (ICs) and semiconducting lasers are usually $Al_2O_3$, but this material has a disadvantage that its thermal conductivity is not high enough.

Diamond has the highest thermal conductivity among various materials. Although attempts have been made in some fields where diamond is used as a heat dissipating substrate, this type of heat dissipating substrate utilizing diamond can not be widely used because they are natural 2A-type diamond of which thermal conductivity is high but they have limited availability and high price. Another problem associated with natural diamond is heterogeneous thermal conductivity due to nonuniform distribution of nitrogen, and hence it is difficult to supply substrates with a reproducible thermal property. Further, diamond is a very hard material and difficult to fabricate in the manufacturing process of heat sinks, therefore manufacturing cost is very high. Heat dissipating substrates have been developed using artificially synthesized diamonds (Japanese under provisional Publication sho 60-12747). However this type of heat dissipating substrate, even though artificially synthesized diamond is used, still has a disadvantage that extremely high pressure is needed for its synthesis, very complex manufacturing process is required and its manufacturing cost is high.

Under these backgrounds, a heat dissipating substrate has been developed with diamond grown by chemical vapor deposition (CVD). In those heat dissipating substrates, the substrates contain impurity to improve its electric conductivity (Japanese under Provisional Publication sho 61-251158) or the diamond heat sink is obtained by growing diamond on a plate-like substrate by CVD in order to reduce a polishing process which may significantly increase the manufacturing cost (Japanese under Provisional Publication 2-273960).

However, diamond films formed by CVD as represented by plasma CVD and hot filament CVD methods consist of polycrystalline diamond except for the diamond film formed on a cubic BN (referred hereinafter as to cBN) substrate. In these polycrystalline diamond films, crystal facets appear irregularly on the film surface and there exists a considerable irregularity of about 0.5 μm between the planes of adjacent crystals. Therefore, when a polycrystalline diamond film is used for a heat sink, the film must be polished to enhance the thermal conductance. However, the manufacturing cost increases by the polishing process.

The thermal conductivity of polycrystalline diamond films is about 10 W/cm·K which is lower than that of natural 2A-type diamond, and therefore they are inferior to natural diamond in heat dissipation characteristics. Likewise, a single crystal diamond grown on a cBN substrate is disadvantageous because is a very hard material and therefore its machining is difficult. In addition, inexpensive single crystal cBN is not available. Therefore, in so far as diamond heat dissipating substrates are concerned, polycrystalline diamond films and not single crystal diamond films must be used.

SUMMARY OF THE INVENTION

It is an object of the present invention to provide a highly-oriented diamond film heat dissipating substrate which can reduce the manufacturing cost and significantly improve the thermal conductivity of the substrate.

The highly-oriented diamond film heat dissipating substrate according to the present invention comprises a highly-oriented diamond film grown by CVD. At least 90% of surface area of said diamond film consists of either (100) or (111) crystal planes. Between the adjacent (100) or (111) crystal planes, the differences $\{\Delta\alpha, \Delta\beta, \Delta\gamma\}$ of Euler angles $\{\alpha, \beta, \gamma\}$, which represent the orientations of the crystals, satisfy $|\Delta\alpha| \leq 5°$, $|\Delta\beta| \leq 5°$ and $|\Delta\gamma| \leq 5°$, simultaneously.

FIGS. 1A and 1B show diagrammatically the surface structure of a diamond film of the present invention wherein the (100) crystal planes are highly-oriented according to this invention. This diagram defines the x-axis and the y-axis which cross at right angles to each other in a film surface, also defining the normal direction of the film surface as the z-axis. The Euler angles indicating the orientation of crystal plane of the (i)th diamond crystal and the adjacent (j)th diamond crystal are to be regarded as $\{\alpha_i, \beta_i, \gamma_i\}$ and $\{\alpha_j, \beta_j, \gamma_j\}$ respectively, and the angle differences between the two $\{\Delta\alpha, \Delta\beta, \Delta\gamma\}$.

The Euler angles $\{\alpha, \beta, \gamma\}$ indicate the orientation of the crystal plane that can be attained by rotating the standard crystal plane around the standard coordinates of axis x, y and z by the angles $\alpha$, $\beta$ and $\gamma$ one after another.

According to this invention, the highly oriented diamond film satisfies ($|\Delta\alpha| \leq 5°$, $|\Delta\beta| \leq 5°$ and $|\Delta\gamma| \leq 5°$) simultaneously. It therefore follows that the crystals are oriented to a high degree.

For the case of crystals with the (111) crystal planes, the crystals are highly oriented as well and the carrier mobility becomes high when all the absolute values of the differences in Euler angles are below 5°. Such a highly-oriented diamond film can be formed, for instance, by subjecting a silicon substrate to microwave irradiation while applying a negative bias in the gas phase containing methane gas after the silicon substrate has been mirror-finished.

In the present invention, at least 90% of the surface area of the highly-oriented diamond film is covered with either (100) or (111) crystal planes. Because the same kind of crystal has the same growth rate of crystal plane, the difference of the height of crystal planes is eliminated or minimized compared with that of the prior art polycrystalline diamond films if the diamond film is grown for a long period. Continuing such film growth for a long period also results in a reduction of space between said crystal planes and the 100% coverage of film surface is achieved.

Therefore, the surface of diamond film becomes flat and therefore the polishing process, which has been necessary for the prior art, can be eliminated, and the heat dissipating substrate can be manufactured by controlling only the time required for growth of the film. Thus, the manufacturing cost can be significantly reduced.

The highly-oriented diamond film according to the present invention may still contains grain boundaries between diamond grains. However, in this highly-oriented diamond film, the misorientation between crystal planes is small due to the high orientation of crystalline planes.

Therefore, the diamond film according to the present invention has a better thermal conductivity than the prior art polycrystalline diamond.

If the coverage ratio of a diamond film is less than 90%, its thermal conductivity is similar to that of the prior art polycrystalline diamond films and therefore any improvement of thermal conductivity can not be observed. This is because of the restriction of thermal conductivity by grain boundaries existing irregularly as in the case of the prior art polycrystalline films.

In diamond grown by CVD, addition of impurities is effective to improve thermal conductivity. In the highly-oriented diamond film, thermal conductivity can be improved by adding at least one component selected from the group consisting of B, Si, As and Sb. By doing, almost the same thermal conductivity as that of natural diamond can be obtained.

Further advantage of the highly-oriented diamond film according to the present invention is that there is no limitation of surface area unlike single crystal diamond because said highly-oriented diamond film can be deposited on silicon wafers and the like which have the surface area of several inches in diameter.

BRIEF DESCRIPTION OF THE DRAWINGS

FIG. 1A shows the standard crystal plane orientation, while FIG. 1B shows the surface structure of the highly-oriented diamond film with the (100) crystal planes.

DETAILED DESCRIPTION OF THE PREFERRED EMBODIMENTS

Figure 1A:
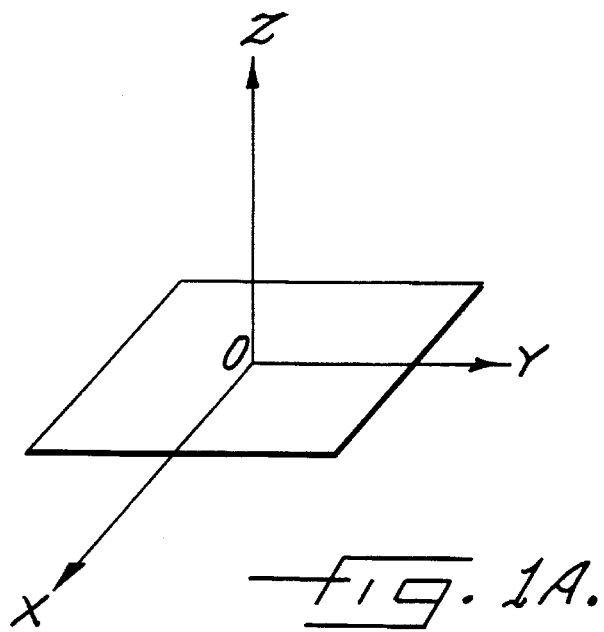
FIGS. 1A and 1B are the diagrams showing the surface and the Euler angles for the highly-oriented diamond film.
Figure 1B:
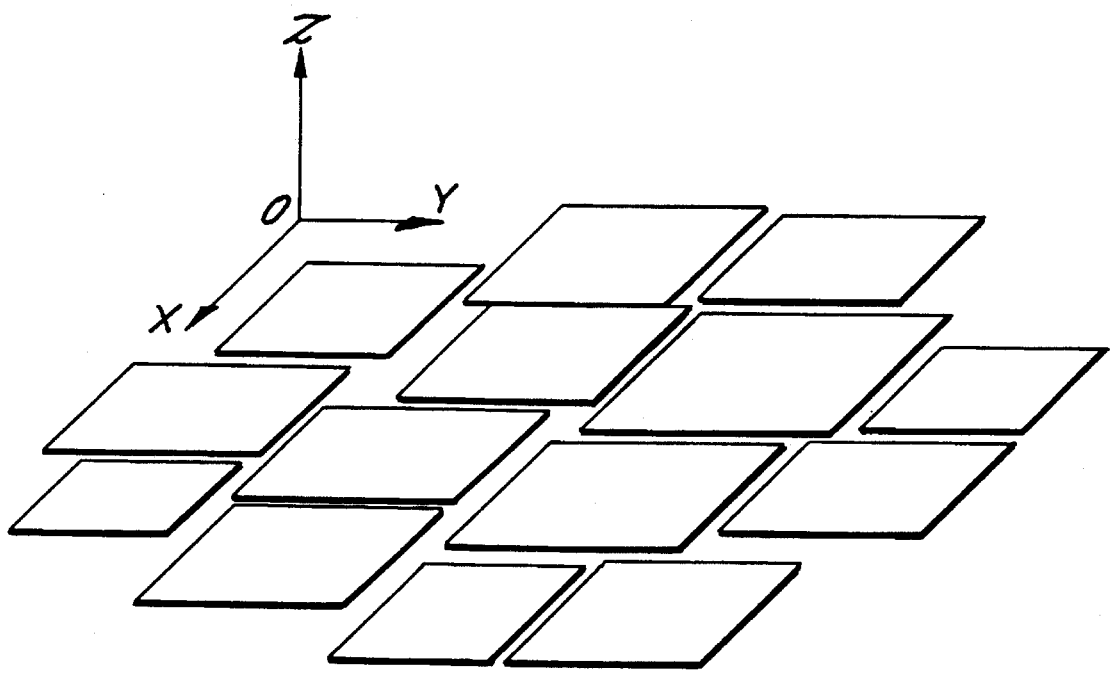

The example of the present invention will be explained comparing with the comparative example. First, the manufacturing process will be explained:

(Step 1)

An one-inch silicon wafer of (100) cut was used as a substrate to deposit a highly-oriented diamond film thereon. The substrate was placed in a chamber for microwave CVD and treated for 15 minutes under the following conditions: the source gas is 3% methane and 97% hydrogen, the gas pressure was 25 Torr, the gas flow rate was 300 ml/min, and the substrate temperature was 650° C. A power source of about 1000 W was used to generate the microwave, but the power was adjusted so as to maintain the constant substrate temperature at 650° C. At the same time, a negative bias was applied to the substrate. The negative biasing current was 10 mA/cm$^2$.

(Step 2)

A diamond film deposition was continued for 400 hours under the following conditions: the source gas was 0.5% methane, 99.4% hydrogen and 0.1% oxygen, the gas pressure was 35 Torr, the gas flow rate was 300 ml/min, and the substrate temperature was 800° C. As a result, the highly-oriented diamond film with about 200 μm of thickness was obtained.

Electron microscopic observation indicated that 94% of this film surface was covered by (100) crystal planes. From a photograph of a fractured edge of the film, the maximum difference of the surface positions between crystals was found to be 0.1 μm.

Two electron microscopic photographs of the film surface were taken each at angle +10° and −10° from the surface normal, the inclination of the (100) crystal plane was determined. The results indicated that the difference of surface inclination between adjacent crystals satisfied all conditions of $|\Delta\alpha|\leq 5°$, $|\Delta\beta|\leq 5°$ and $|\Delta\gamma|\leq 5°$.

A measurement of thermal conductivity of the highly-oriented diamond film resulted in 17 W/cm·K. This value was higher than the value (about 10 W/cm·K) for the prior art polycrystalline diamond film.

Next, results of experiments conducted to determine the effects of orientation on thermal conductivity will be explained. The experiments were repeated by changing conditions listed in aforementioned Step 1 according to Table 1. Sample No. 1 shown in Table 1 was prepared according to the same conditions as listed in Step 1. Other conditions except those shown in Table 1 were the same as mentioned in Steps 1 and 2.

TABLE 1

| Sample No. | Concentration of methane (%) | Concentration of hydrogen (%) | Temperature on substrate (°C.) |
|---|---|---|---|
| 1 | 3 | 97.0 | 650 |
| 2 | 3.2 | 96.8 | 670 |
| 3 | 3.4 | 96.6 | 700 |
| 4 | 3.6 | 96.4 | 720 |
| 5 | 4.0 | 96.0 | 750 |

In the sample 2, the diamond film in which 93% of the film surface were covered by crystals with the (100) crystal plane and the remaining 3% were the spaces between crystals. For adjacent crystalline planes, the relationship of $|\Delta\alpha|\leq 5°$, $|\Delta\beta|\leq 5°$ and $|\Delta\gamma|\leq 5°$ was obtained. On the other hand, in the samples 4 and 5, 87% and 83% respectively of the film surface were covered by (100) crystal planes.

For the sample 3, 90% of the film surface was covered by the crystals with the (100) crystal plane and the absolute values for $\{\Delta\alpha, \Delta\beta, \Delta\gamma\}$ were scattered around 5°. Then, the thermal conductivities of these samples 1 to 5 were determined, and the results are shown in FIG. 2.

Figure 2:
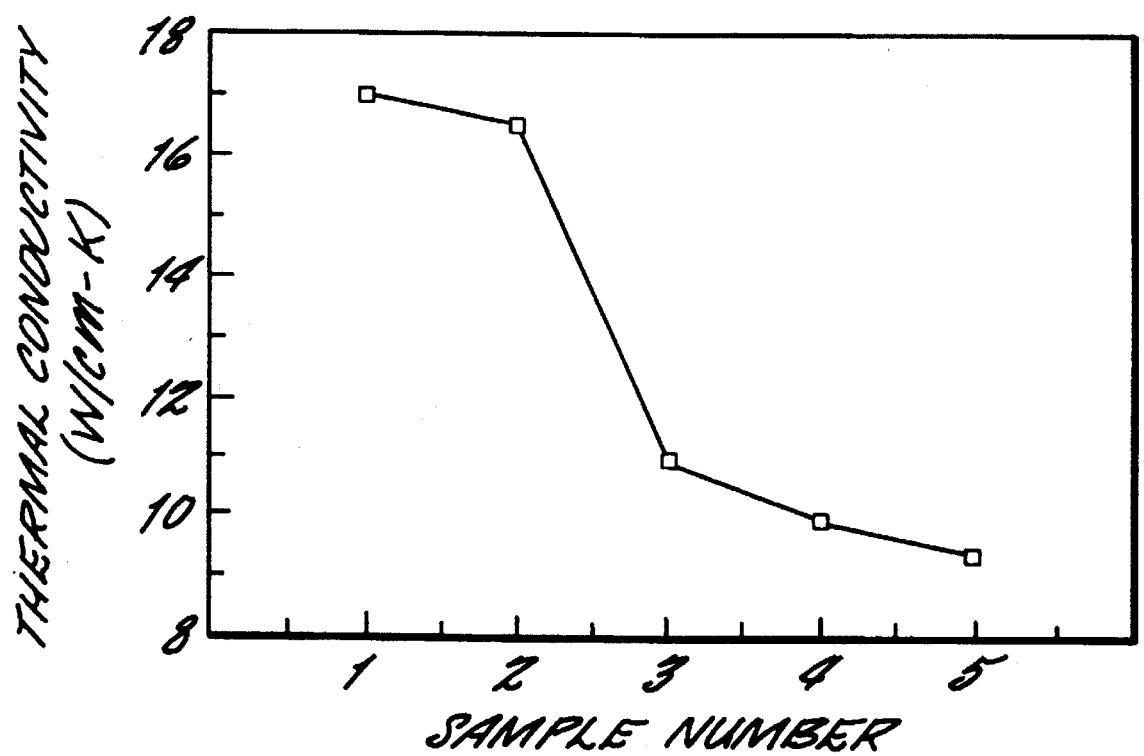
FIG. 2 is a graph showing results of measured thermal conductivity for the highly-oriented diamond films defined in the present invention and for the diamond films in which the conditions are fallen outside the scope of the present invention.

As obvious from FIG. 2, the thermal conductivities for the samples 1 and 2 are significantly different from those for the samples 4 and 5. For the sample 3, since the absolute values for $\{\Delta\alpha, \Delta\beta, \Delta\gamma\}$ were sometimes significantly greater than 5°, the thermal conductivity was low. Thus, using the highly-oriented diamond film defined in the present invention, the heat dissipation substrate having a very high thermal conductivity was obtained.

Results of the thermal conductivity will be explained for the case that impurities were added to the highly-oriented diamond film. After the aforementioned step 1, a P-type semiconducting diamond film was layered. The P-type diamond film deposition was carried out for 440 hours under the following conditions: the source gas was 0.5% methane, 99.5% hydrogen, and 1 ppm diborane (B$_2$H$_6$), the gas pressure was 35 Torr, the gas flow rate was 300 ml/min, the substrate temperature was 800° C. As a result, the highly-oriented P-type diamond film with about 210 μm of thickness was obtained.

A measurement of thermal conductivity for this semiconducting diamond film gave 21 W/cm·K of thermal conductivity. This value was twice higher than that of the prior art polycrystalline diamond film (about 10 W/cm·K) and therefore it is shown that addition of impurity is effective to increase the thermal conductivity in the highly-oriented diamond film according to the present invention.

What is claimed is:

1. A highly-oriented diamond film heat dissipating substrate, comprising a highly-oriented diamond film grown by chemical vapor deposition, in which at least 90% of the surface of said diamond film consists of a plurality of (100) crystal planes and the differences $\{|\Delta\alpha|, |\Delta\beta|, |\Delta\beta\}$ of Euler angles $\{\alpha, \beta, \gamma\}$, which represent the orientations of the crystals, satisfies $0 \leq |\Delta\alpha| \leq 5°$, $0 \leq |\Delta\beta| \leq 5°5°$ and $0 \leq |\Delta\gamma| \leq 5°$ simultaneously between adjacent (100) crystal planes.

2. A highly-oriented diamond film heat dissipating substrate, comprising a highly-oriented diamond film grown by chemical vapor deposition, in which at least 90% of the surface of said diamond film consists of a plurality of (111) crystal planes and the differences $\{|\Delta\alpha|, |\Delta\beta|, |\Delta\gamma|\}$ of Euler angles $\{\alpha, \beta, \gamma\}$, which represent the orientations of the crystals, satisfies $0 \leq |\Delta\alpha| \leq 5°$, $0 \leq |\Delta\beta| \leq 5°$ and $0 \leq |\Delta\gamma| \leq 5°$, simultaneously between adjacent (111) crystal planes.

3. A highly-oriented diamond film heat dissipating substrate according to claim 1 wherein said highly-oriented diamond film is doped with impurities.

4. A highly-oriented diamond film heat dissipating substrate according to claim 2 wherein said highly-oriented diamond film is doped with impurities.

5. A highly-oriented diamond film heat dissipating substrate according to claim 3 wherein said impurities are at least one component selected from the group consisting of B, Si, As and Sb.

6. A highly-oriented diamond film heat dissipating substrate according to claim 4 wherein said impurities are at least one component selected from the group consisting of B, Si, As and Sb.

* * * * *